United States Patent [19]

Ikeda et al.

[11] Patent Number: 5,973,930
[45] Date of Patent: Oct. 26, 1999

[54] MOUNTING STRUCTURE FOR ONE OR MORE SEMICONDUCTOR DEVICES

[75] Inventors: Hironobu Ikeda; Yukio Yamaguti, both of Tokyo, Japan

[73] Assignee: NEC Corporation, Tokyo, Japan

[21] Appl. No.: 09/111,871

[22] Filed: Jul. 8, 1998

[30] Foreign Application Priority Data

Aug. 6, 1997 [JP] Japan ................................. 9-212065

[51] Int. Cl.$^6$ .............................. H05K 1/11; H05K 7/06; H01L 23/488
[52] U.S. Cl. ......................... 361/768; 361/803; 257/723; 257/778
[58] Field of Search ................................... 361/743, 767, 361/768, 783, 784, 803; 257/686, 723, 777, 778

[56] References Cited

U.S. PATENT DOCUMENTS 3,777,221  12/1973  Tatusko et al. ..................... 257/778
5,375,042  12/1994  Arima et al. ....................... 361/784
5,477,933  12/1995  Nguyen .............................. 361/768
5,535,101  7/1996   Miles et al. ....................... 257/686

FOREIGN PATENT DOCUMENTS 4-154136  5/1992  Japan.

Primary Examiner—Leo P. Picard
Assistant Examiner—John B. Vigushin
Attorney, Agent, or Firm—Sughrue, Mion, Zinn, Macpeak & Seas, PLLC

[57] ABSTRACT

A mounting structure wherein, in a semiconductor package mounting position on a wiring board, a package bearing substrate whose external size is substantially equal to or larger than that of the semiconductor package and which has on its upper surface pads for connection to a semiconductor package and on its lower surface pads for connection to the wiring board is arranged, the pads on the wiring board and those on the lower surface of the package bearing substrate are connected by soldering, and the soldered junction is filled and fixed with an under-fill.

9 Claims, 7 Drawing Sheets

MOUNTING STRUCTURE FOR ONE OR MORE SEMICONDUCTOR DEVICES

BACKGROUND OF THE INVENTION

The present invention relates to a mounting structure for one or more semiconductor devices, and more particularly to a mounting structure for one or more semiconductor devices allowing packaging in substantially the same size as the semiconductor device or devices and multi-pin mounting in high density.

A conventional semiconductor device mounting structure is disclosed in Japanese Patent Application Laid-open No. Hei 4-154136.

The mounting structure for semiconductor devices described in the Japanese Patent Application has a film carrier interposed between a bare chip and a substrate. The basic material of the film carrier is either a ceramic, such as alumina or aluminum nitride, or an organic material, such as polyimide or Teflon. On the upper surface of the film carrier are arranged pads for connection to the electrodes of flip chips, and on its lower surface are pads for connection to the electrodes of the substrate. Junctions between the flip chips and the film carrier may be Au (gold) to Au junctions, Au to Sn (tin) junctions or the like, and the film carrier and the substrate are soldered to each other.

Generally, where a semiconductor package mounted with a bare chip is to be mounted on a wiring board, it is necessary to match the thermal expansion coefficient of the semiconductor package itself and that of the wiring board, or where the difference in thermal expansion coefficient between the two is significant, it is necessary to disperse the stress in the junction and improve the reliability of connection by sealing in an under-filling material or the like.

However, the prior art referred to above takes no account of the thermal expansion coefficients of the bare chip and the film carrier. In order to secure the connection reliability of the junction between the bare chip and the film carrier, the basic material of the film carrier should preferably be aluminum nitride, whose thermal expansion coefficient is close to that of silicon (Si) chips, but the use of this material would give rise to the problem of a difference in thermal expansion coefficient between aluminum nitride and the wiring board and, if the film carrier is mounted on a printed circuit board having a high thermal expansion coefficient, a problem would arise as to the reliability of connection between the film substrate and the printed circuit board.

Where a bare chip is to be directly mounted on a printed circuit board, it is also common to seal in an under-filling material between the bare chip and the printed circuit board to ensure the connection reliability of the junction, but in the event of serious enough trouble with the bare chip to necessitate its replacement, the fixation with the under-filling material makes it prohibitively difficult to replace the bare chip.

An object of the present invention is to provide a mounting structure for one or more semiconductor devices, of which the external contour of the package is substantially as large as that of the integrated circuit chip, and which permits multi-pin connection and high-density packaging.

Another object of the invention is to provide a mounting structure for one or more semiconductor devices using a printed circuit board, which is inexpensive as a substrate on which to mount a semiconductor device and compatible with a large size.

Still another object of the invention is to provide a mounting structure permitting ready replacement of a defective or broken-down semiconductor device.

SUMMARY OF THE INVENTION

A mounting structure for one or more semiconductor devices according to the invention uses a wiring board for mounting a semiconductor package, which includes a semiconductor device, wherein a package bearing substrate whose external size is substantially equal to or larger than that of said semiconductor package and which has electrodes for connection to said semiconductor package on its upper surface and electrodes for connection to said wiring board on its lower surface is arranged in the position of mounting said semiconductor package on said wiring board; the electrodes of said wiring board and those on the lower surface of said package bearing substrate are connected by soldering, and the soldered connection part is filled with an under-filling material to fix said wiring board and said package bearing substrate together.

Another mounting structure for one or more semiconductor devices according to the invention is provided with a plurality of package bearing substrates arranged on said wiring board.

Still another mounting structure for one or more semiconductor devices according to the invention is provided with one of said semiconductor package is connected onto one package bearing substrate on said wiring board by soldering.

Yet another mounting structure for one or more semiconductor devices according to the invention is provided with a plurality of package bearing substrates are arranged on said wiring board, and one of said semiconductor packages is connected to one package bearing substrate by soldering.

Another mounting structure for one or more semiconductor devices according to the invention is provided with a plurality of said semiconductor packages connected with solder bumps to one package bearing substrate arranged on said wiring board.

Still another mounting structure for one or more semiconductor devices according to the invention is provided with a plurality of package bearing substrates arranged on said wiring board, wherein a plurality of said semiconductor packages are connected with solder bumps to one package bearing substrate.

In another mounting structure for one or more semiconductor devices according to the invention, the thermal expansion coefficient of the package substrate bearing substrate arranged on said wiring board is substantially equal to that of said semiconductor package.

In still another mounting structure for one or more semiconductor devices according to the invention, the difference between the thermal expansion coefficient of the package substrate bearing substrate arranged on said wiring board and that of said semiconductor package is not more than 50% of the thermal expansion coefficient of said semiconductor package.

In yet another mounting structure for one or more semiconductor devices according to the invention, the melting point of the solder connecting said wiring board and the package bearing substrate arranged on said wiring board is the same as that of the solder connecting said package bearing substrate and said semiconductor package.

In another mounting structure for one or more semiconductor devices according to the invention, the melting point of the solder connecting said wiring board and the package bearing substrate arranged on said wiring board is higher than that of the solder connecting said package bearing substrate and said semiconductor package.

BRIEF DESCRIPTION OF THE DRAWINGS

Other features and advantages of the present invention will become more apparent from the following detailed description when taken in conjunction with the accompanying drawings, in which.

DETAILED DESCRIPTION OF THE PREFERRED EMBODIMENTS

Description will next be made in detail on a mounting structure for one or more semiconductor devices of the present invention, with reference to the accompanying drawings.

Figure 1:
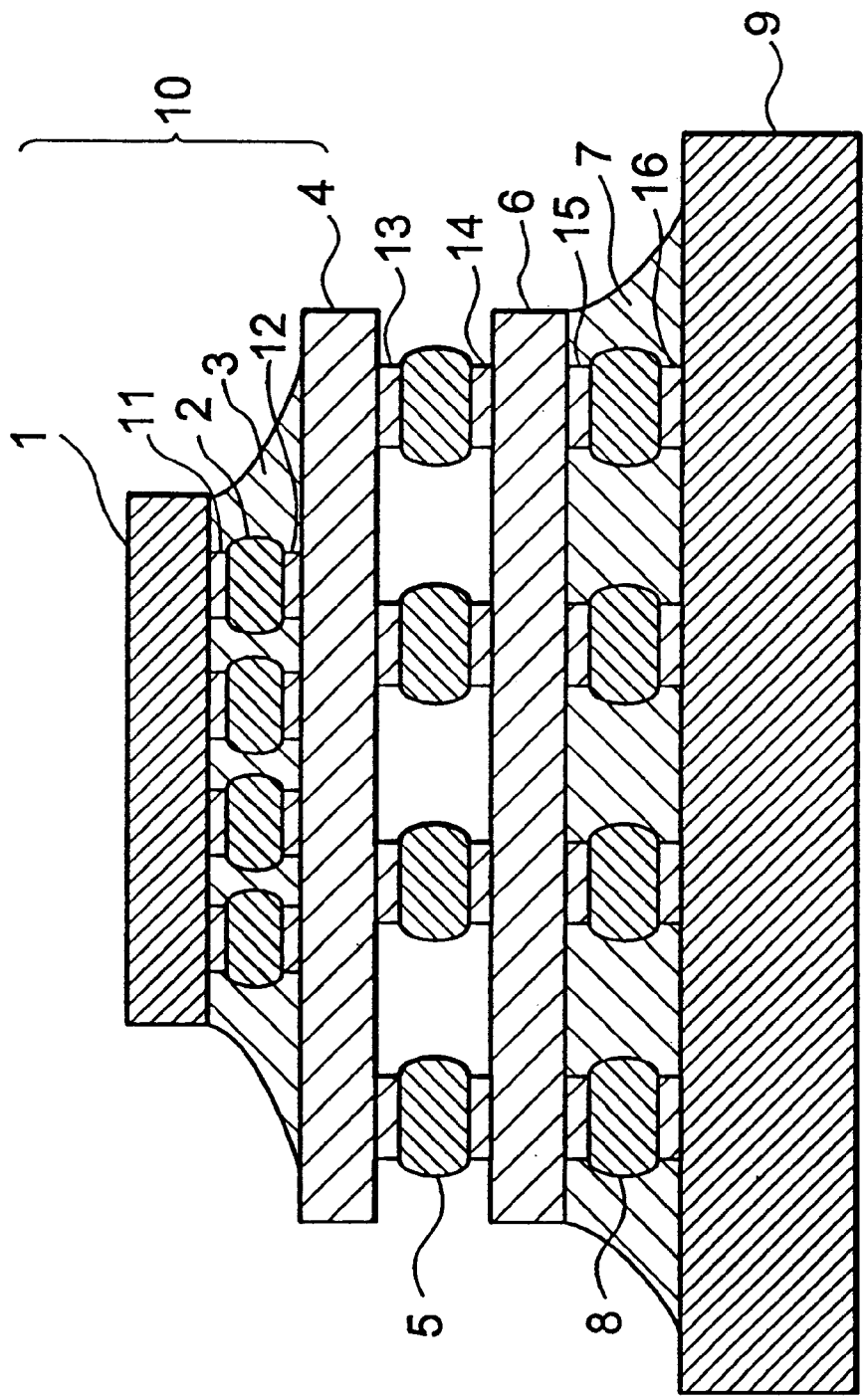
FIG. 1 shows a cross-sectional view of a first preferred embodiment of the invention.

Referring to FIG. 1, a first embodiment of the mounting structure of the invention comprises a semiconductor package 10 including a semiconductor device 1; a package bearing substrate 6 for mounting the semiconductor package 10; solder pieces 5 for electrically and mechanically connecting the semiconductor package 10 and the package bearing substrate 6; a wiring board 9 for mounting the package bearing substrate 6; solder pieces 8 for electrically and mechanically connecting the package bearing substrate 6 and the wiring board 9; and an under-fill 7 filling the gap between the package bearing substrate 6 and the wiring board 9.

If the external dimensions of the package bearing substrate 6 are 30 mm×30 mm and the spacing between adjoining pads 15 on the lower surface of the package bearing substrate 6 is 1 mm, about 900 pads 15 can be arranged in a grid pattern. Pads 16 arranged on the upper surface of the wiring board are disposed in positions matching the pads 15 on the lower surface of the package bearing substrate 6, and the pads 16 on the upper surface of the wiring board 9 and the pads 15 on the lower surface of the package bearing substrate 6 are connected to each other by the solder pieces 8. Where a common printed circuit board is used as wiring board 9 and a ceramic material is used for the package bearing substrate 6, stresses due to a difference in thermal expansion coefficient arise in the soldered parts and the padded parts. While the thermal expansion coefficient of the printed circuit board is 20 to 30 ppm, that of a ceramic material, for instance alumina, is about 7 ppm, resulting in a wide difference in thermal expansion coefficient, that of the printed circuit board being three to four times as high as that of alumina. If the temperature varies, the two will expand or contract differently, and this difference will give rise to concentrated stresses in the soldered parts and the padded parts. These stresses would invite cracks in solder or cause pads to come off, possibly resulting in electrical openness. To avoid this problem, the gap between the package bearing substrate 6 and the wiring board 9 is filled with the under-fill 7 of, for instance epoxy resin, to fix them firmly together. The under-fill 7 serves to disperse the stresses caused by the difference in thermal expansion, making it possible to prevent the soldered parts from cracking and the pads from coming off.

Figure 2:
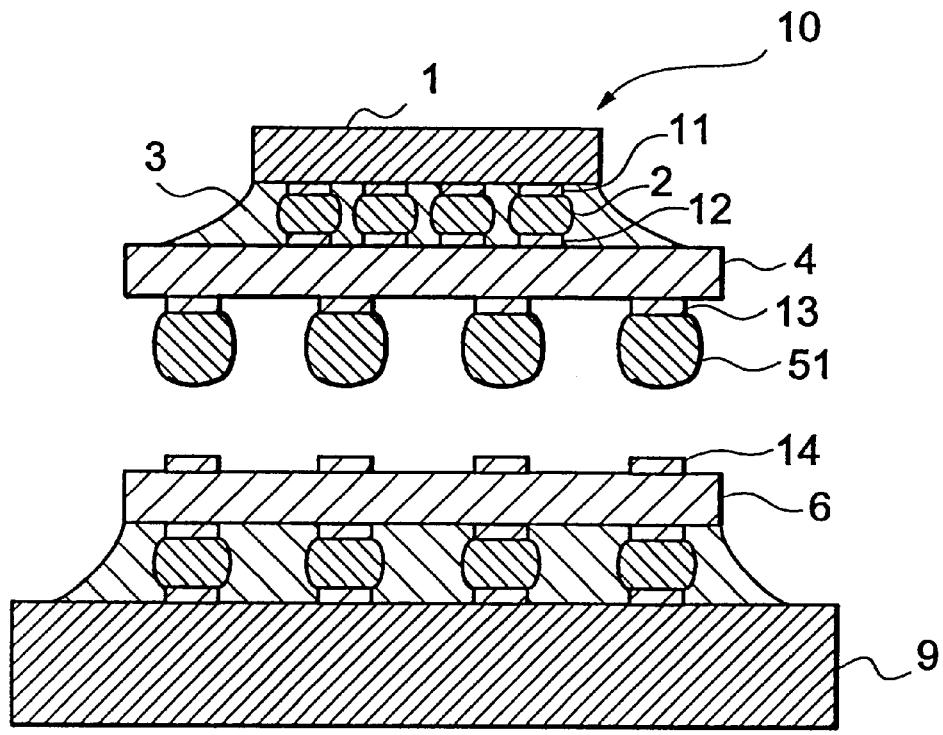
FIGS. 2A and 2B show cross-sectional views illustrating aspects of a manufacturing method for the first preferred embodiment of the invention.
Figure 2:
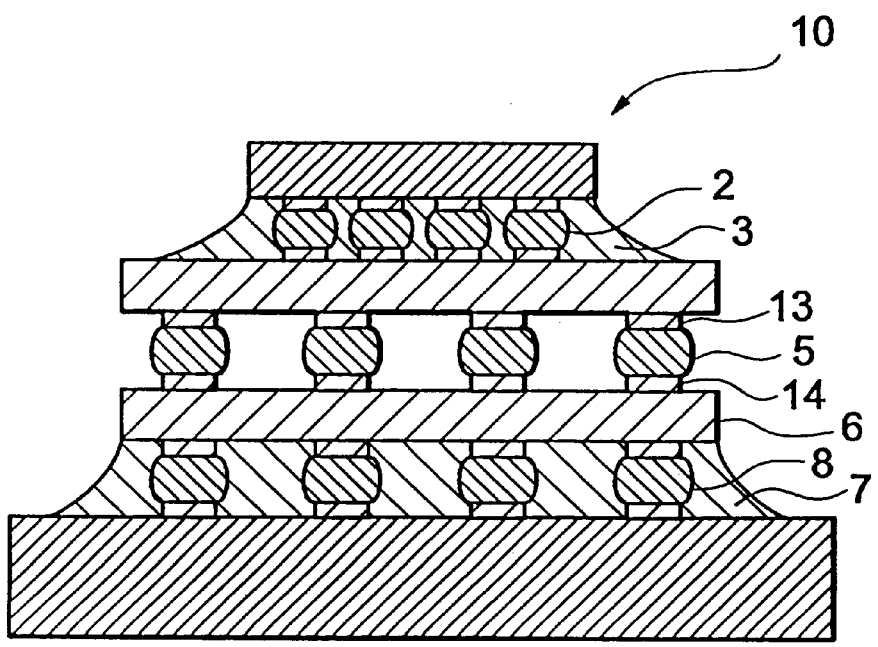

FIG. 2A is a cross-sectional view illustrating the semiconductor package 10 and the package bearing substrate 6 fitted on the wiring board 9. As shown in FIG. 2A, the semiconductor package 10 mounted on the package bearing substrate 6 is a ball grid array (BGA) type package having solder bumps 51 as external terminals. On the circuit plane of the lower surface of the semiconductor device 1 are arranged pads 11 in either a grid pattern or near the periphery. The semiconductor device 1 is mounted on a carrier substrate 4 having on its upper surface pads 12 arranged in the same manner as the pads 11. The pads 11 of the semiconductor device 1 and the pads 12 on the upper surface of the carrier substrate 4 are connected with solder pieces 2, and the gap between the semiconductor device 1 and the carrier substrate 4 is filled with an under-fill 3. If the external dimensions of the semiconductor device 1 are 15 mm×15 mm and the spacing between adjoining pads 11 of the semiconductor device 1 is 0.5 mm, about 900 pads 11 can be arranged in a grid pattern. The pads 12 on the upper surface of the carrier substrate 4 are arranged in the same manner as the pads 11 of the semiconductor device 1 are. The external dimensions of the carrier substrate are 30 mm×30 mm, and 900 pads 13 are arranged on the lower surface of the carrier substrate 4 at 1 mm intervals in a grid pattern as the pads 14 on the upper surface of said package bearing substrate 6 are. The pads 12 on the upper surface and the pads 13 on the lower surface, both of the carrier substrate 4, are connected to each other as desired by wiring in inner and outer layers of the carrier substrate 4. As the extremely narrow 0.5 mm spacing of the pads 12 on the upper surface of the carrier substrate 4 makes it difficult to manufacture this substrate out of a usual through-hole type printed circuit board, it is desirable to use a ceramic material, such as alumina, for the carrier substrate 4. The semiconductor device 1 is made of silicon, whose thermal expansion coefficient is about 3 ppm. On the other hand, if the carrier substrate 4 is made of alumina, its thermal expansion coefficient is about 7 ppm. As stated above, this difference in thermal expansion coefficient between the semiconductor device 1 and the carrier substrate 4 will give rise to concentrated stresses in the soldered parts and the padded parts connecting them, and might invite cracks in solder or cause pads to come off. To avoid this problem, the gap between the semiconductor device 1 and the carrier substrate 4 is filled with the under-fill 3 to disperse the stresses caused by the difference in thermal expansion, making it possible to secure the connection reliability of the junction. The under-fill 3, which may consist of epoxy resin or the like, also serves to protect the circuit surface of the semiconductor device 1.

FIG. 2B is a cross-sectional view illustrating a configuration in which the semiconductor package 10 is arranged on the wiring board 9. The external shape of the carrier substrate 4 of the semiconductor package 10 and that of the package bearing substrate 6 are substantially the same, and the arrangement of the pads 13 on the lower surface of the carrier substrate 4 of the semiconductor package 10 and that of the pads 14 on the upper surface of said package bearing substrate 6 are the same, the pads 13 and 14 being electrically and mechanically connected to each other by the solder pieces 5. Even if the carrier substrate 4 and the package bearing substrate 6 differ in external shape, there will be no problem if the pads 13 and the pads 14 are arranged in the same manner. The material of the carrier substrate 4 should be the same as that of the package bearing substrate 6. For instance, if alumina is used for the carrier substrate 4, the package bearing substrate 6 should also be made of alumina. By using the same material for the carrier substrate 4 and the package bearing substrate 6, the difference in thermal expansion coefficient between the carrier substrate 4 and the package bearing substrate 6 can be reduced to zero, and concentrated stresses invited by any temperature variation in the solder pieces 5 and the pads 13 and 14 can be brought infinitely close to zero. Accordingly, connection reliability can be secured without having to fill the gap between the carrier substrate 4 and the package bearing substrate 6 with an under-filling material as stated above.

Although it was stated that the same material should be used for the carrier substrate 4 and the package bearing substrate 6, if the difference in thermal expansion coefficient between the carrier substrate 4 and the package bearing substrate 6 is not more than 50% of the thermal expansion coefficient of the carrier substrate 4, there will be no great enough stresses working on the solder pieces 5 and the pads 13 and 14 to create a problem. Examples of materials to be used include glass ceramic, whose thermal expansion coefficient is about 5 ppm, for the carrier substrate 4, and alumina ceramic, about 7 ppm in thermal expansion coefficient, for the package bearing substrate 6.

In the event that the semiconductor device 1 runs into trouble, the semiconductor package 10 will have to be replaced. Whereas the replacement would require heating until the solder pieces 5, connecting the pads 13 of the carrier substrate 4 and the pads 14 of the package bearing substrate 6, are melted, the solder pieces 2 connecting the semiconductor device 1 and the carrier substrate 4, if they have the same melting point as the solder pieces 5, will also be melted then, but the semiconductor device 1 and the carrier substrate 4, as they are stuck together by the under-fill 3, will not separate from each other. Similarly, the solder pieces 8 connecting the package bearing substrate 6 and the wiring board 9, if they have the same melting point as the solder pieces 5, will also be melted then, but the wiring board 9 and the package bearing substrate 6, as they are stuck together by the under-fill 7, will not separate from each other. Therefore, the semiconductor package 10 can be readily replaced by melting the solder pieces 5. The solder for use in connecting the carrier substrate 4 and the package bearing substrate 6 may be eutectic solder consisting, for instance, of Sn and Pb in a 63/37 weight ratio, and similarly eutectic solder is used for the solder pieces 2 and 8. If a solder having a higher melting point than that for the solder pieces 5, for example one of Sn and Pb in a 10/90 weight ratio, is used for the solder pieces 2 and 8, only the solder pieces 5 connecting the carrier substrate 4 and the package bearing substrate 6 can be melted when the semiconductor package 10 is to be replaced, without melting the solder pieces 2 connecting the semiconductor device 1 and the carrier substrate 4 or the solder pieces 8 connecting the package bearing substrate 6 and the wiring board 9.

Next will be described in detail a manufacturing method for the mounting structure for semiconductor devices according to the invention with reference to accompanying drawings.

First will be described a step to fit the package bearing substrate 6 onto the wiring board 9.

Figure 3:
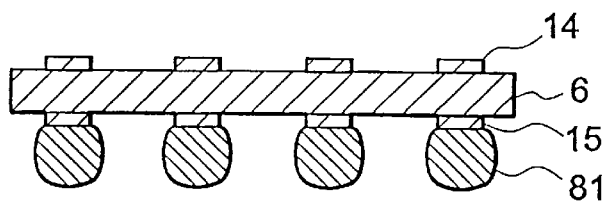
FIGS. 3A to 3C shows cross-sectional views illustrating other aspects of the manufacturing method for the first embodiment of the invention.
Figure 3:
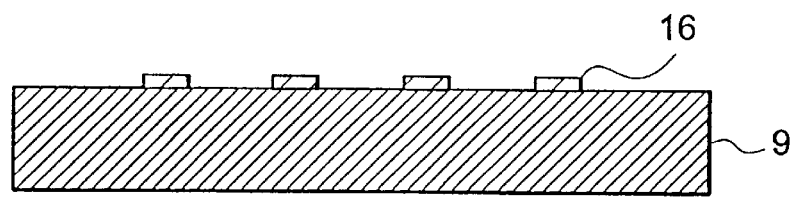
Figure 3:
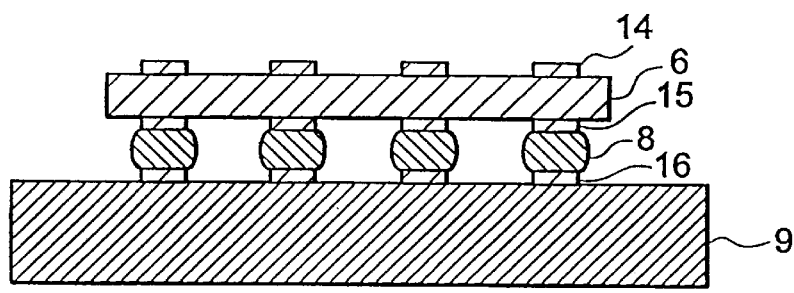

Referring to FIG. 3A, solder bumps 81 are provided over the pads 15 on the lower surface of the package bearing substrate 6. One way to provide the solder bumps 81 is to supply cream solder onto the pads 15 of the package bearing substrate 6 by screen printing, and perform heated reflowing, i.e. heating the cream solder at 210° C. if it is eutectic solder of Sn and Pb in a 63/37 weight ratio. The cream solder will then be melted to form the hemispherical solder bumps 81. Another way is to arrange solder balls, so shaped in advance, over the pads 15 and subject them to heated reflowing. Where the space between adjoining pads 15 on the package bearing substrate 6 is 1 mm, the pads 15 should desirably be spherical, measuring about 0.5 mm in diameter, and the height of the solder bumps 81 should preferably be 0.5 to 0.7 mm approximately.

Next, the pads 16 on the wiring board 9 and the solder bumps 81 on the package bearing substrate 6 are aligned to overlap each other and subjected to heated reflowing so that, as illustrated in FIG. 3B, the pads 15 of the package bearing substrate 6 and the pads 16 of the wiring board 9 are electrically and mechanically connected to each other by the solder pieces 8. The size of the pads 16 on the wiring board 9 should preferably be substantially equal to that of the pads 15 of the package bearing substrate 9. A gap of about 0.5 mm is secured between the package bearing substrate 6 and the wiring board 9 by the surface tension of the solder pieces 8.

The next step is that of filling the gap between the package bearing substrate 6 and the wiring board 9 with the under-fill 7 as shown in FIG. 3C. The under-fill 7 is injected from the periphery of the package bearing substrate 6. The under-fill 7 should consist of thermosetting epoxy resin or the like, and desirably be supplied from one side or two adjoining sides of the package bearing substrate 6 to prevent any void from occurring in the gap between the package bearing substrate 6 and the wiring board 9. The under-fill 7 is injected with a dispenser, and the injected under-fill 7 permeates the gap between the package bearing substrate 6 and the wiring board 9 by capillary action. When the gap between the package bearing substrate 6 and the wiring board 9 is completely filled with the under-fill 7, the under-fill 7 is heated to its setting temperature to be hardened.

Next will be described a step to fabricate the semiconductor package 10.

Figure 4:
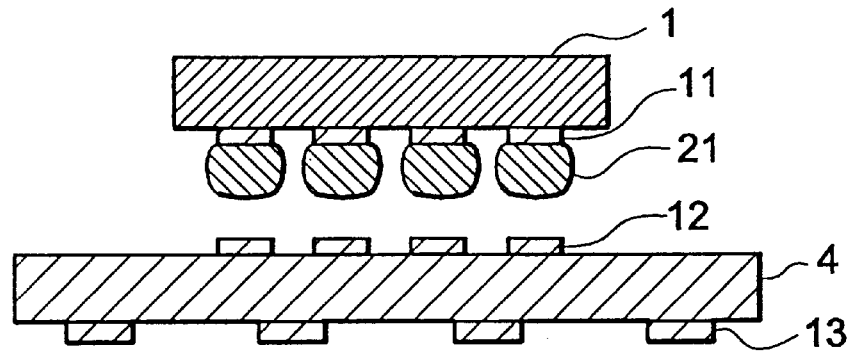
FIGS. 4A to 4C are cross-sectional views illustrating further aspects of the manufacturing method for the first embodiment of the invention.
Figure 4:
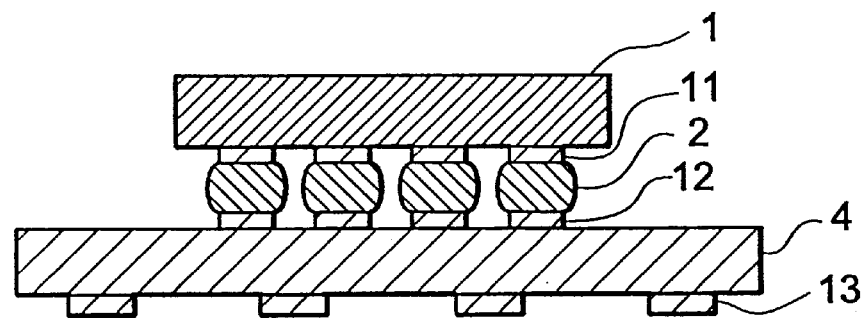
Figure 4:
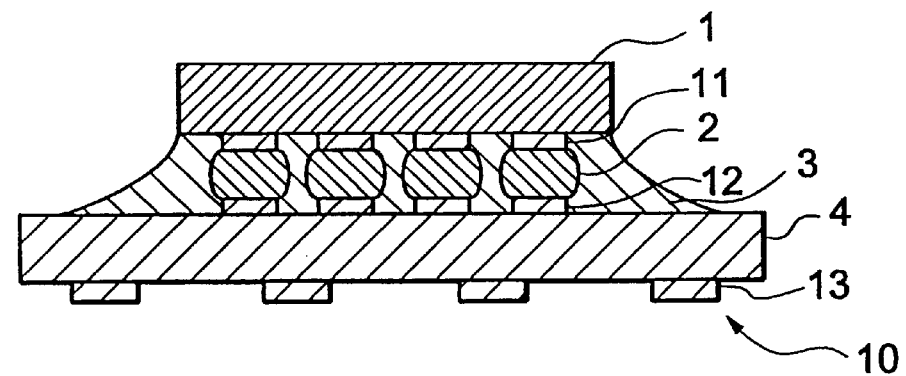

Referring to FIG. 4, the manufacturing method for the semiconductor package 10 is substantially the same as the above-described method to fit the package bearing substrate 6 to the wiring board 9. As illustrated in FIG. 4A, first, solder bumps 21 are provided in advance onto the pads 11 of the semiconductor device 1. Where the spacing between adjoining pads 11 of the semiconductor device 1 is as fine as 0.5 mm, it is difficult to apply a cream solder printing method, and accordingly it is desirable to supply solder balls so shaped in advance. The solder balls are arranged over the pads 11, and subjected to heated reflowing at, for instance, 210° C. if they are made of eutectic solder of Sn and Pb in a 63/37 weight ratio, to thereby form the solder bumps 21.

Next, the pads 12 on the upper surface of the carrier substrate 4 and the solder bumps 21 on the semiconductor device 1 are aligned to overlap each other and subjected to heated reflowing so that, as illustrated in FIG. 4B, the pads 11 of the semiconductor device 1 and the pads 12 of the carrier substrate 4 are electrically and mechanically connected to each other by the solder pieces 2. The size of the pads 11 of the semiconductor device 1 should preferably be substantially equal to that of the pads 12 of the carrier substrate 4.

The next step is that of filling the gap between the semiconductor device 1 and the carrier substrate 4 with the under-fill 3 as shown in FIG. 4C. The under-fill 3, which consists of thermosetting epoxy resin or the like as the aforementioned under-fill 7 does, should desirably be supplied from one side or two adjoining sides of the semiconductor device 1 with a dispenser to prevent any void from occurring in the gap between the semiconductor device 1 and the carrier substrate 4. When the gap between the semiconductor device 1 and the carrier substrate 4 is completely filled with the under-fill 3, the under-fill 3 is heated to its setting temperature to be hardened.

Next will be described a step to fit the semiconductor package 10 onto the package bearing substrate 6 fitted on the wiring board 9.

Referring to FIG. 2A, solder bumps 51 are provided over the pads 13 on the lower surface of the carrier substrate 4 of the semiconductor package 10. One way to provide the solder bumps 51 is to supply cream solder onto the pads 13 of the carrier substrate 4 by screen printing, and perform heated reflowing, i.e. heating the cream solder at 210° C. if it is eutectic solder of Sn and Pb in a 63/37 weight ratio. The cream solder will then be melted to form the hemispherical solder bumps 51. Another way is to arrange solder balls, so shaped in advance, over the pads 13 and subject them to heated reflowing. Where the space between adjoining pads 13 on the carrier substrate 4 is 1 mm, the pads 13 should desirably be spherical, measuring about 0.5 mm in diameter, and the height of the solder bumps 51 should preferably be 0.5 to 0.7 mm approximately.

Next, the pads 14 on the package bearing substrate 6 and the solder bumps 51 on the carrier substrate 4 are aligned to overlap each other and subjected to heated reflowing so that, as illustrated in FIG. 2B, the pads 13 of the carrier substrate 4 and the pads 14 of the package bearing substrate 6 are electrically and mechanically connected to each other by the solder pieces 5. The size of the pads 14 on the package bearing substrate 6, too, should preferably be substantially equal to that of the pads 13 of the carrier substrate 4. A gap of about 0.5 mm is secured between the carrier substrate 4 and the package bearing substrate 6 by the surface tension of the solder pieces 5. This completes the step to fit the semiconductor package 10 onto the package bearing substrate 6 fitted on the wiring board 9.

Next will be described with reference to a drawing a second preferred embodiment of the present invention, which is characteristic in that a plurality of package bearing substrates are arranged on a wiring board. In other aspects of the configuration, it is the same as the first embodiment.

Figure 5:
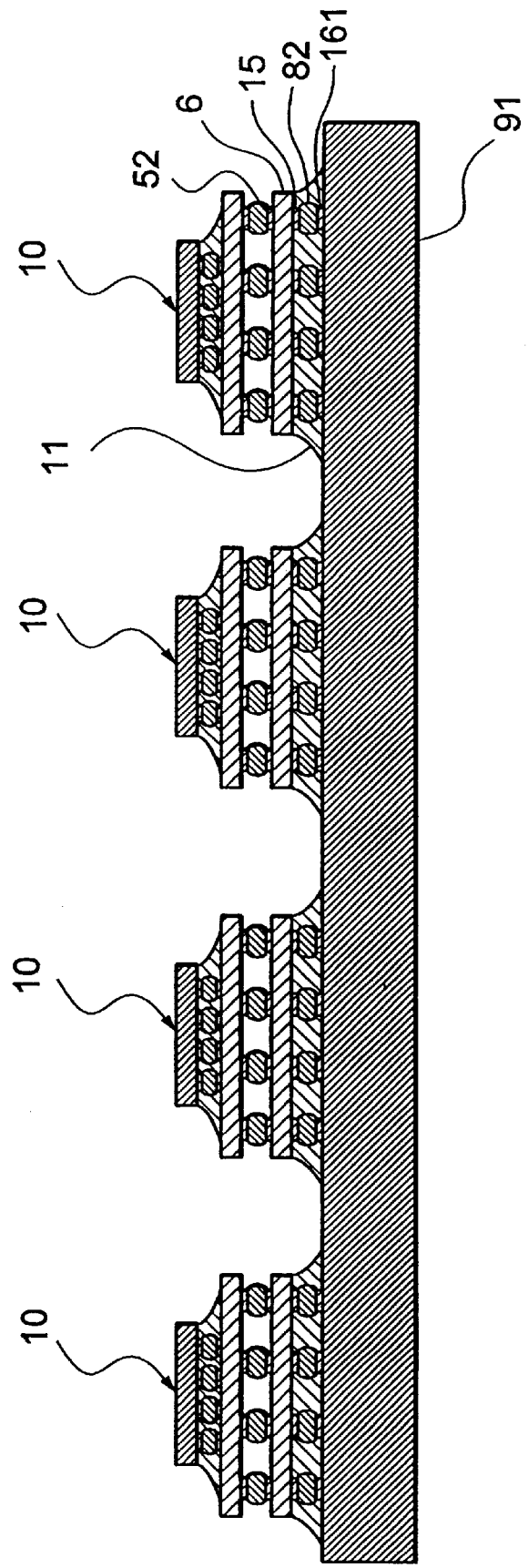
FIG. 5 shows a cross-sectional view of a second preferred embodiment of the invention.

Referring to FIG. 5, a plurality of package bearing substrates 6 are arranged on a wiring board 91 and, as in the first embodiment, pads 15 on the lower surface of each package bearing substrate 6 are electrically and mechanically connected to pads 161 of the wiring board 91 by solder pieces 82, with the gaps between the package bearing substrates 6 and the wiring board 91 being filled with under-fills 71. Onto each of the package bearing substrates 6 is electrically and mechanically connected one semiconductor package 10 with solder pieces 52.

Next will be described with reference to a drawing a third preferred embodiment of the present invention, which is characteristic in that a plurality of semiconductor packages are mounted on a package bearing substrate on a wiring board. In other aspects of the configuration, it is the same as the first embodiment.

Figure 6:
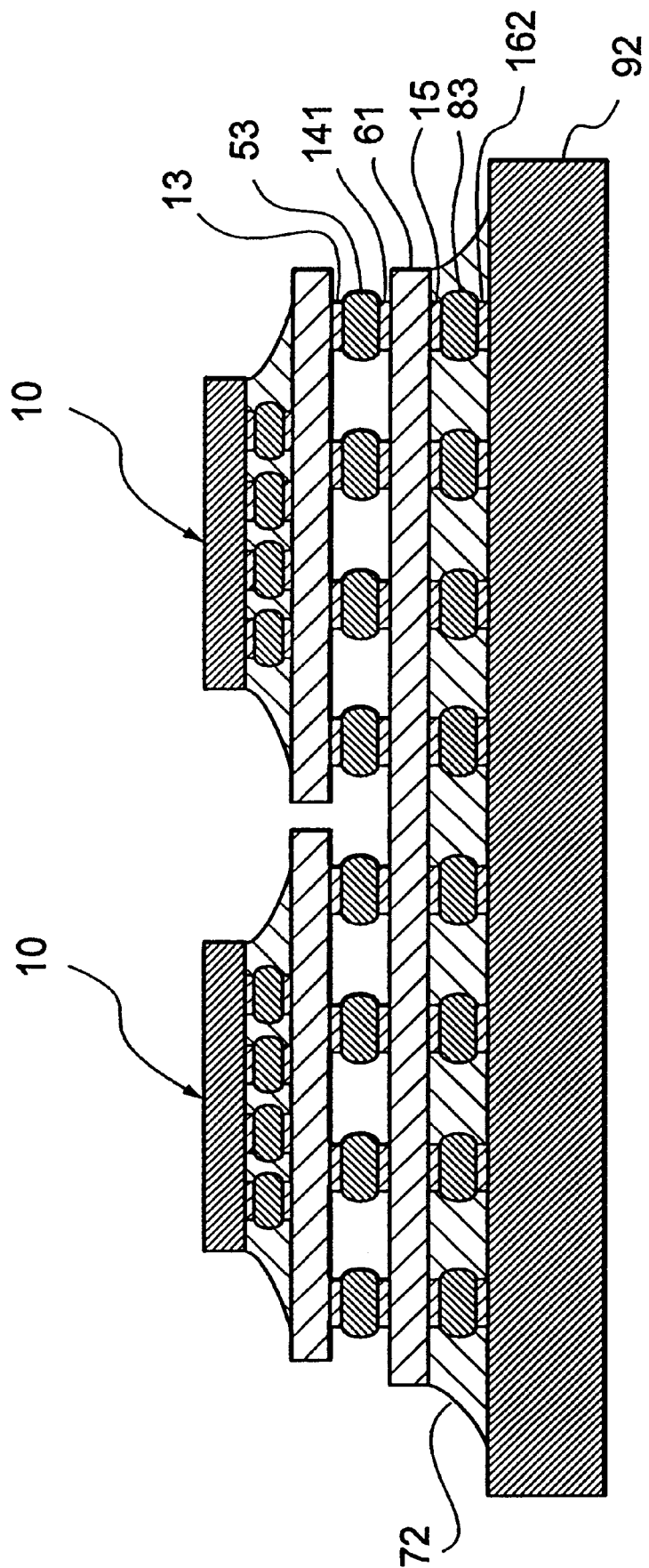
FIG. 6 shows a cross-sectional view of a third preferred embodiment of the invention.

Referring to FIG. 6, onto a package bearing substrate 61 on a wiring board 92, a plurality of semiconductor packages 10 are electrically and mechanically connected by solder pieces 53. Pads 141 on the package bearing substrate 61 are arranged so that pads 13 of the plurality of semiconductor packages 10 match them, and pads 151 on the lower surface of the package bearing substrate 61 and pads 162 on the wiring board 92 are electrically and mechanically connected by solder pieces 83, and the gap between the package bearing substrate 61 and the wiring board 92 is filled with an under-fill 72 to disperse stresses working on soldered parts and padded parts as described above. However, where the thermal expansion coefficient of the package bearing substrate 61 greatly differs from that of the wiring board 92, for instance where the package bearing substrate 61 is made of alumina and a printed circuit board is used as wiring board 92, if the external dimensions of the package bearing substrate 61 are too great, the stresses will become too severe to be eased by the under-fill 72, possibly causing the under-fill itself to become cracked or come off. Therefore the external dimensions of the package bearing substrate 61 should desirably be at most about 50 mm×50 mm.

Next will be described with reference to a drawing a fourth preferred embodiment of the present invention, which is characteristic in that a plurality of package bearing substrates are mounted on a wiring board, and a plurality of semiconductor packages are mounted on each of said package bearing substrates. In other aspects of the configuration, it is the same as the first embodiment.

Figure 7:
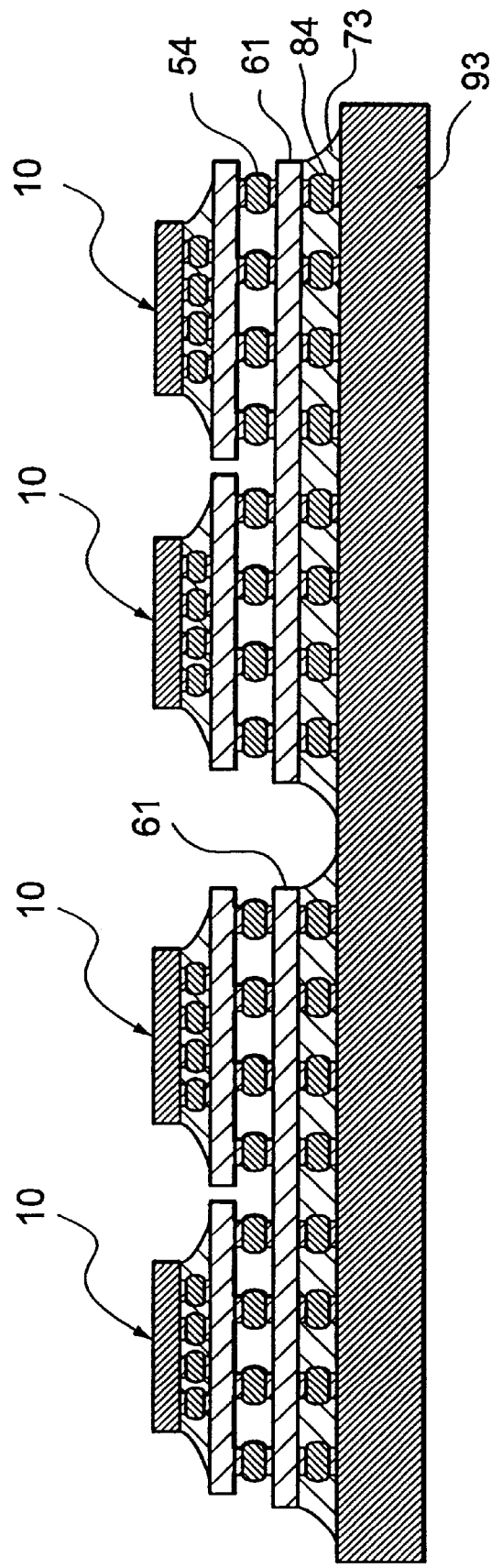
FIG. 7 shows a cross-sectional view of a fourth preferred embodiment of the invention.

Referring to FIG. 7, a plurality of package bearing substrates 61 are arranged on a wiring board 93, and the wiring board 93 and the package bearing substrates 61 are electrically and mechanically connected by solder pieces 84, with the gaps between the wiring board 93 and the package bearing substrates 61 being filled with under-fills 73. On the package bearing substrates 61 are mounted a plurality of semiconductor packages 10 in the same configuration as in the third preferred embodiment of the invention.

As is evident from the foregoing description, according to the present invention, a semiconductor package(s) is (are) mounted by soldering onto a package bearing substrate(s) arranged on a wiring board connected by soldering, with the gap(s) between them filled with an under-fill(s), and the carrier substrate of the semiconductor package(s) and said package bearing substrate(s) are substantially equal or close to each other, with the result that the semiconductor package (s) can be mounted onto the package bearing substrates) by direct soldering. It is made possible to arrange soldered terminals at fine spacing, and thereby enable a high density multi-pin mounting structure to be realized.

Furthermore, as said semiconductor package(s) is (are) connected onto said package bearing substrate(s) only by soldering, the semiconductor package(s) can be readily replaced.

What is claimed is:

1. A mounting structure for one or more semiconductor devices comprising:
    a wiring board having at least one semiconductor package mounted thereon, said semiconductor package including at least one semiconductor device;
    a package bearing substrate whose external size is substantially equal to or larger than that of said semiconductor package and which has first electrodes for connection to said semiconductor package on its upper surface and second electrodes for connection to said wiring board on its lower surface;
    solder pieces for connecting third electrodes of said wiring board and said second electrodes on the lower surface of said package bearing substrate, respectively; and an under-filling material which fills a gap between said wiring board and said package bearing substrate;

wherein the thermal expansion coefficient of said package bearing substrate arranged on said wiring board is substantially equal to that of said semiconductor package.

2. A mounting structure as claimed in claim 1, wherein a plurality of package bearing substrates are mounted on said wiring board.

3. A mounting structure as claimed in claim 1, wherein one said semiconductor package is connected onto one package bearing substrate on said wiring board by soldering.

4. A mounting structure as claimed in claim 1, wherein a plurality of package bearing substrates are arranged on said wiring board, and one said semiconductor package is connected to one package bearing substrate by soldering.

5. A mounting structure as claimed in claim 1, wherein a plurality of said semiconductor packages are connected to one package bearing substrate on said wiring board by soldering.

6. A mounting structure as claimed in claim 1, wherein a plurality of package bearing substrates are arranged on said wiring board, and a plurality of said semiconductor packages are connected to one package bearing substrate by soldering.

7. A mounting structure as claimed in claim 3, wherein the difference between the thermal expansion coefficient of the package bearing substrate arranged on said wiring board and that of said semiconductor package is not more than 50% of the thermal expansion coefficient of said semiconductor package.

8. A mounting structure as claimed in claim 3, wherein the melting point of the solder connecting said wiring board and the package bearing substrate arranged on said wiring board is equal to that of the solder connecting said package bearing substrate and said semiconductor package.

9. A mounting structure as claimed in claim 3, wherein the melting point of the solder connecting said wiring board and the package bearing substrate arranged on said wiring board is higher than that of the solder connecting said package bearing substrate and said semiconductor package.

* * * * *